(12) United States Patent
Morikawa et al.

(10) Patent No.: US 8,168,272 B2
(45) Date of Patent: May 1, 2012

(54) STORAGE CONTAINER FOR PHOTOMASK-FORMING SYNTHETIC QUARTZ GLASS SUBSTRATE

(75) Inventors: Mamoru Morikawa, Joetsu (JP); Daijitsu Harada, Joetsu (JP); Masaki Takeuchi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 773 days.

(21) Appl. No.: 12/181,710

(22) Filed: Jul. 29, 2008

(65) Prior Publication Data
US 2009/0035497 A1  Feb. 5, 2009

(30) Foreign Application Priority Data
Jul. 31, 2007 (JP) .................................. 2007-199626

(51) Int. Cl.
*B65D 81/00* (2006.01)
(52) U.S. Cl. ...................... 428/34.5; 428/34.1; 428/34.4; 206/455; 206/449
(58) Field of Classification Search ................. 428/34.4, 428/34.5, 34.1; 206/455
See application file for complete search history.

(56) References Cited

U.S. PATENT DOCUMENTS

| | | | | |
|---|---|---|---|---|
| 6,066,192 A * | 5/2000 | Toshinaga et al. | ................ | 95/93 |
| 2005/0006266 A1* | 1/2005 | Kurikawa | ..................... | 206/455 |
| 2005/0077204 A1 | 4/2005 | Sumi et al. | | |
| 2005/0188962 A1* | 9/2005 | Oda et al. | ..................... | 123/519 |

FOREIGN PATENT DOCUMENTS

| | | |
|---|---|---|
| EP | 1 601 013 A1 | 11/2005 |
| JP | 8-148551 A | 6/1996 |
| JP | 2000-174109 A | 6/2000 |
| JP | 2004-153221 A | 5/2004 |
| JP | 2004-179449 A | 6/2004 |
| JP | 2004-193272 A | 7/2004 |
| JP | 2005-153963 A | 6/2005 |

OTHER PUBLICATIONS

English-language machine translation of Japanese Patent Application Publication JP 2005-153963 (Jun. 16, 2005), downloaded from / www.ipdl.inpit.go.jp/homepg_e.ipdl> on Apr. 21, 2011.*
European Search Report dated Nov. 28, 2008, issued in corresponding European Patent Application No. 08252583.3.

\* cited by examiner

*Primary Examiner* — Rena Dye
*Assistant Examiner* — Yan Lan
(74) *Attorney, Agent, or Firm* — Westerman, Hattori, Daniels & Adrian, LLP; Shuji Yoshizaki

(57) ABSTRACT

A storage container for containing a photomask-forming synthetic quartz glass substrate comprises inner walls facing the front and back surfaces of the glass substrate, and reservoirs provided on the container inner walls for receiving an absorber for components outgassing from the container. A ratio A/B is in the range of 1.0-120 $m^2/cm^2$ provided that A is the product ($m^2$) of the total weight (g) of the absorber multiplied by the BET specific surface area ($m^2/g$) of the absorber and B is the total area ($cm^2$) of the front and back surfaces of the glass substrate.

11 Claims, 2 Drawing Sheets

US 8,168,272 B2

STORAGE CONTAINER FOR PHOTOMASK-FORMING SYNTHETIC QUARTZ GLASS SUBSTRATE

CROSS-REFERENCE TO RELATED APPLICATION

This non-provisional application claims priority under 35 U.S.C. §119(a) on Patent Application No. 2007-199626 filed in Japan on Jul. 31, 2007, the entire contents of which are hereby incorporated by reference.

TECHNICAL FIELD

This invention relates to a storage container for containing microelectronic material, and specifically a synthetic quartz glass substrate for use as photomask in the advanced microelectronic technology.

BACKGROUND ART

The progress of microelectronic devices toward higher integration has created an increasing demand for the photolithography capable of forming a pattern with reduced feature size. At an initial stage of photolithography, a coating is often deposited on a synthetic quartz glass substrate. As the feature size of wiring pattern is reduced, the deposition technique which is free of coating variations is desired. For this and other reasons, it becomes requisite that the synthetic quartz glass substrate is stored so as to avoid any detrimental effect of chemicals which would otherwise adsorb to the substrate, prior to the coating deposition.

The effect of adsorbed chemicals is detrimental particularly on synthetic quartz glass substrates for liquid crystal-related photomasks. Since the liquid crystal photomask-forming synthetic quartz glass substrates are generally of large size, a container tends to receive a limited number of substrates on account of awkward manipulation. In the case of rectangular substrates having a long side in excess of 500 mm, for example, the container receives a single substrate. As the number of substrates accommodated in a container is limited, the inside surface area of the container becomes larger compared with the surface area of the substrates, indicating a probability that the substrates are more susceptible to contamination by outgassing from the container material.

Since photomask-forming synthetic quartz glass substrates of large size are manufactured through an extended process, their production architecture is often designed with an adequate margin. Specifically, glass substrates ready for use are accommodated in individual containers and stored as stocks for a long period of time. This tendency also worsens the problem of contamination by outgassing from the container material.

For preventing the influence of adsorbing chemicals, JP-A 2004-153221, JP-A 2004-179449, and JP-A 2004-193272 describe a container provided with a filter containing activated carbon and ameliorate the mechanism of the filter. Since the pressure difference between the interior and the exterior of the container is minimized or eliminated, these containers allegedly prevent contamination from the ambient atmosphere due to a pressure difference occurring during transportation. They provide an unsatisfactory countermeasure to outgassing within the container due to the container material.

JP-A 8-148551 describes a substrate container provided with a blower and activated carbon for removing organic matter. JP-A 2000-174109 describes a container having disposed therein a fan, a chemical filter, and a desiccant such as activated carbon wherein the fan is operated to circulate the air within the container to maintain a cleanness. The containers of these two patents may perform well when the substrates are stored at a certain place. However, they are unsuited in an application where the substrates are transported to a certain destination because the container is provided with a fan or circulation mechanism of electric drive. That is, these containers are unsuited for shipment to end users.

DISCLOSURE OF THE INVENTION

An object of the invention is to provide a container for containing a synthetic quartz glass substrate for use as photomask in which the amount of an absorber such as activated carbon and the position thereof in the container are controlled so as to prevent outgassing components of the container from adsorbing to the glass substrate.

The inventors have found that it is possible to prevent outgassing components of the container from adsorbing to the glass substrate by providing the container with an absorber such as activated carbon and controlling the amount and position of the absorber.

The invention provides a storage container for containing a synthetic quartz glass substrate for use as photomask, the glass substrate having front and back surfaces. The storage container comprises inner walls facing the front and back surfaces of the glass substrate, and one or more reservoirs provided on the container inner wall or walls facing the front surface or the front and back surfaces of the glass substrate, for receiving an absorber for components outgassing from the container. The container satisfies a ratio A/B in the range of 1.0 to 120 m$^2$/cm$^2$ provided that A is the product (m$^2$) of the total weight (g) of the absorber multiplied by the BET specific surface area (m$^2$/g) of the absorber and B is the total area (cm$^2$) of the front surface or the front and back surfaces of the glass substrate facing the container inner wall provided with the reservoir.

In a preferred embodiment, the reservoir is disposed at such a position that the longest straight distance L (mm) between the reservoir and the glass substrate opposed thereto is within 800 mm.

In a typical embodiment, the container is rectangular parallelepiped, and the container inner wall or walls facing the front surface or the front and back surfaces of the glass substrate have short sides and long sides. The reservoir is disposed at a position such that the longest straight distance L (mm) between the reservoir and the glass substrate opposed thereto is within 800 mm. The position is at least one position selected from intersections and the center of the container inner wall, said intersections being defined by dividing the length (mm) of the short side and the length (mm) of the long side by 450 mm, omitting decimal parts from the divided values, thus obtaining integral values, and equidistantly partitioning the short and long sides of the container inner wall at partition lines corresponding to the integral values, with the partition lines crossing to define intersections.

In a preferred embodiment, the storage container comprises a rectangular box-shaped housing for containing a rectangular synthetic quartz glass substrate, the housing having an upper opening and two pairs of opposed inner walls; a lid detachably mated to the housing for closing the upper opening; and a pair of opposed support means provided on a pair of opposed inner walls of the housing for supporting the glass substrate along a pair of opposed edges thereof, so that the glass substrate is vertically or horizontally held along the pair of opposed edges by the support means in the container.

When the glass substrate is vertically or horizontally held in the container, the space inside the container is preferably divided into compartments by the glass substrate.

In a further embodiment, the synthetic quartz glass substrate is a rectangular substrate having a short side of at least 300 mm and a long side of at least 400 mm.

In still further embodiments, the absorber comprises activated carbon; and the reservoir is a flat bag made of gas permeable nonwoven fabric of synthetic resin.

BENEFITS OF THE INVENTION

The storage container of the invention contains a synthetic quartz glass substrate which is suitable for use as a photomask playing an important role in forming a pattern by photolithography. Little chemical adsorption occurs on the substrate surface during long-term shelf storage. This minimizes deposition variation when a film such as a chromium film is later deposited on the glass substrate, leading to improvements in production efficiency and yield.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DESCRIPTION OF THE PREFERRED EMBODIMENT

Figure 1:
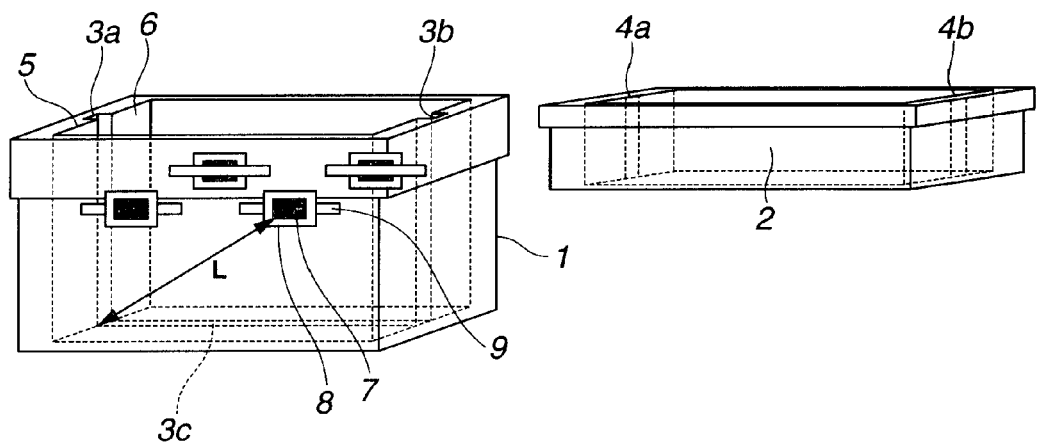
FIG. 1 is a schematic view of a container consisting of a housing and a lid and having two reservoirs disposed on one inner wall in one embodiment of the invention.

While photomask-forming synthetic quartz glass substrates are shelf stored, it is desired to inhibit or minimize adsorption of gas components to the glass substrates. In general, plastic storage containers allow for outgassing or volatilization of plasticizer and other components, which can adsorb to the glass substrates to cause detrimental problems.

The invention relates to a storage container for containing a synthetic quartz glass substrate for use as photomask. The glass substrate has front and back major surfaces, and the storage container has a pair of inner walls facing the front and back surfaces of the glass substrate. An absorber capable of absorbing components outgassing from the container, typically activated carbon, silica gel or the like, is disposed within the container. By adjusting the amount and position of the absorber so that outgassing components from the storage container and a package bag or the like, if present, may be effectively adsorbed on the absorber, the outgassing components with which the container would otherwise be filled are reduced.

According to the invention, one or more reservoirs are provided on the storage container inner wall or walls facing the front surface or the front and back surfaces of the glass substrate, for receiving the absorber capable of absorbing components outgassing from the container. The amount and position of the absorber or reservoir are adjusted such that a ratio A/B is in the range of 1.0 to 120 $m^2/cm^2$, more specifically 2.0 to 20 $m^2/cm^2$, and even more specifically 2.0 to 10 $m^2/cm^2$, provided that A is the product ($m^2$) of the total weight (g) of the absorber multiplied by the BET specific surface area ($m^2/g$) of the absorber and B is the total area ($cm^2$) of the front surface or the front and back surfaces of the glass substrate facing the container inner wall provided with the reservoir. A ratio A/B of less than 1.0 $m^2/cm^2$ may lead to insufficient adsorption of outgassing components. A ratio A/B of more than 120 $m^2/cm^2$ corresponds to a situation that the inner wall of the container is substantially covered with the absorber, giving rise to problems including increased dusting from the absorber and a pack for the absorber, and a time-consuming operation of disposing such a large number of absorber packs.

As used herein, the "front surface" of a synthetic quartz glass substrate is a surface on which a photomask pattern is to be formed. In order to prevent outgassing components from adsorbing to at least the front surface of the glass substrate, the absorber is disposed on the container inner wall facing the front surface of the glass substrate. Since outgassing components emerging from the inner wall of the container directly facing the front surface of the glass substrate are most detrimental to the front surface of the substrate, it is not necessarily needed to dispose the absorber on the other inner wall of the container facing the back surface of the glass substrate. However, a portion of the substrate front surface adjacent to the edge can be affected more or less by outgassing components emerging from the other inner wall of the container facing the substrate back surface. It is thus preferred that the absorber is also disposed on the other inner wall of the container facing the substrate back surface. The area B used in the calculation of ratio A/B is the area of the surface of the glass substrate facing the container inner wall where the absorber is disposed, and specifically, the area of only the front surface of the substrate when the absorber is disposed only on the front surface-facing inner wall, and the total area of the front and back surfaces of the substrate when the absorbers are disposed on both the front and back surface-facing inner walls.

The BET specific surface area of the absorber is as measured by the nitrogen adsorption BET method. Examples of the absorber include, but are not limited to, silica gel and activated carbon, examples of which include powdered, granular, spherical, and fibrous activated carbons.

The absorber is received in the reservoir. The arrangement of the reservoir(s) is determined relative to the surface of the glass substrate facing the reservoir(s). Specifically, the reservoir is disposed at such a position that the longest straight distance L (mm) between the reservoir and the glass substrate opposed thereto is preferably within 800 mm and more preferably within 550 mm. If the position of the reservoir is outside the range, the effect of absorber in the reservoir becomes weakened. If the reservoir is disposed remote from the substrate, the absorber in the reservoir may fail to prevent adsorption of outgassing components to the entire substrate front surface. Note that the longest straight distance L (mm) between the reservoir and the glass substrate opposed thereto is measured from the origin which corresponds to the center of the reservoir. Where two or more reservoirs are disposed on the same inner wall, the longest straight distance L is determined by drawing straight lines between the reservoirs and the glass substrate opposed thereto, projecting the lines onto the container inner wall where the reservoirs are disposed, and selecting the longest one of the straight lines originating from one reservoir and not crossing the other reservoirs.

In one embodiment, the container is rectangular parallelepiped and includes rectangular inner walls which face the front and back surfaces of the glass substrate and have short sides and long sides. In a preferred embodiment, one or more reservoirs are disposed at one or more positions which are selected from intersections and the center of the container inner wall, the intersections being defined by dividing the length (mm) of the short side and the length (mm) of the long side by 450 mm, omitting decimal parts from the divided values (or quotients), thus obtaining integral values, and equidistantly partitioning the short and long sides of the container inner wall at partition lines corresponding to the integral values (referred to as "integral partition"), with the partition lines crossing to define intersections.

In an example where reservoirs are disposed on the rectangular inner wall of the container facing the front surface of a rectangular synthetic quartz glass substrate having a short side of 1,220 mm and a long side of 1,400 mm, candidate positions are determined by dividing the length (mm) of the short side and the length (mm) of the long side by 450 mm, omitting decimal parts from the divided values (specifically, 2.71 for the short side and 3.11 for the long side), thus obtaining integral values (specifically, 2 and 3), and equidistantly partitioning the short and long sides of the container inner wall at partition lines corresponding to the integral values (specifically, 2 and 3). That is, two partition lines partition the short side into ⅓ segments, and three partition lines partition the long side into ¼ segments. Apparently, these partition lines cross at six intersections. As a result, these six intersections and the center of the rectangular inner wall of the container become candidate positions at which the reservoirs can be disposed. Then the reservoir(s) may be disposed at one or more positions selected from the six intersections and the container inner wall center. In order that the longest straight distance L (mm) between the reservoir at any intersection and the glass substrate opposed thereto is within 800 mm, four to six reservoirs may be disposed at the center and selected intersections.

The shape and material of the reservoir are not particularly limited. Preferably the reservoir is a flat bag which is made of nonwoven fabric of synthetic resin such as polyester so that the bag is gas permeable. An exemplary reservoir has a size between 20×20 mm and 200×200 mm and a volume to receive about 1 to 100 g, more specifically about 5 to 20 g of the absorber.

The absorber reservoir is disposed on the container inner wall by any suitable means, for example, by securing the reservoir to the wall with an adhesive or the like.

While a synthetic quartz glass substrate is contained and stored in the storage container, the support means in the container may be oriented so that the front surface of the glass substrate may extend either vertically or horizontally relative to the ground during storage.

In this regard, the number of glass substrates contained in the storage container may be one, two or more. Where the container contains more than one glass substrate, the glass substrates are arranged in a preferred embodiment such that the front surfaces of the outermost substrates face the inner walls of the container.

In this preferred embodiment, the spacing between the front surface of the outermost glass substrate that faces the container inner wall and the container inner wall is preferably 1 to 15 cm, and more preferably 2 to 10 cm. In the event the container contains a single glass substrate, the spacing between the front surface of the glass substrate and the container inner wall facing that surface is preferably 1 to 15 cm, and more preferably 2 to 10 cm. If the spacing between the glass substrate front surface and the container inner wall is too close, there is a risk of contact between the absorber and the substrate or of dusting from the absorber or the absorber reservoir. If the glass substrate front surface is spaced too remote from the container inner wall, the container itself must have a large volume, which is inconvenient for storage and transportation.

The storage container may be used with rectangular synthetic quartz glass substrates having short and long sides of dimensions (mm) including 330×450, 370×450, 420×520, 420×530, 430×530, 440×520, 500×750, 520×610, 520×800, 620×720, 650×750, 650×800, 700×800, 800×920, 700×1100, 800×960, 830×960, 850×1000, 830×1196, 850×1200, 830×1396, 810×1380, 850×1400, 1220×1400, and 1300×1500 mm. For ease of handling, the container may contain a plurality of glass substrates if the substrates have a short side of less than 500 mm; and the container may contain a single glass substrate if the substrate has a short side equal to or more than 500 mm. While the thickness of the substrate varies with the planar dimensions thereof, it is generally 1 to 50 mm thick, and preferably 5 to 20 mm thick. Specifically the container is best suited to contain glass substrates having a short side of at least 300 mm and a long side of at least 400 mm, more preferably a short side of 400 to 3,000 mm and a long side of 500 to 5,000 mm, and even more preferably a short side of 500 to 3,000 mm and a long side of 610 to 5,000 mm.

Referring to FIG. 1, one exemplary storage container for containing a photomask-forming synthetic quartz glass substrate is illustrated. The storage container is illustrated as comprising a rectangular box-shaped housing 1 for containing a rectangular synthetic quartz glass substrate (not shown), the housing having an upper opening, and a lid 2 detachably mated to the housing 1 for closing the upper opening. The housing 1 has two pairs of opposed inner walls, an open top and a closed bottom. A pair of opposed inner walls of the housing are formed with a pair of channels 3a, 3b which extend from the top to the bottom and are longitudinally opposed to each other. The inner wall of the bottom of the housing is also formed with a channel 3c which connects the above channels 3a, 3b. Supports of U-shaped cross-section (not shown) are fitted in channels 3a, 3b, 3c. The glass substrate is inserted into the channels so that the glass substrate along a pair of longitudinally opposed edges is sandwiched between the supports. Then the glass substrate is vertically held along the pair of opposed edges by the support means (supports and channels).

The lid 2 may also be provided with supports of U-shaped cross-section (as on the housing walls) or other shape. In one embodiment wherein lid 2 is provided with supports of U-shaped cross-section (as is housing 1), the opposed inner walls of the lid 2 are formed with channels 4a, 4b corresponding to channels 3a, 3b, and supports of U-shaped cross-section (not shown) are fitted therein. In the other embodiment wherein lid 2 is provided with supports of different shape from those on housing 1, a stretchable silicone tube having a diameter of about 10 to 20 mm is disposed on a ceiling of lid 2 so that when lid 2 is rested on housing 1, the silicone tube comes in contact with the top edge of the glass substrate whereby the glass substrate at its opposed edges is sandwiched between the silicone tube on the lid side and the channel 3c in the housing bottom. At this point, a gap is left between lid 2 and a fraction of the edge of the glass substrate that is outside the contact with the silicone tube, but the gap is at most about 10 mm. In these embodiments wherein the lid is provided with supports of the same or different shape, when the glass substrate is held by housing 1 and lid 2, the space inside the container is divided into a plurality of compartments (two compartments 5 and 6 in the embodiment of FIG. 1 wherein a single glass substrate is held).

Figure 3:
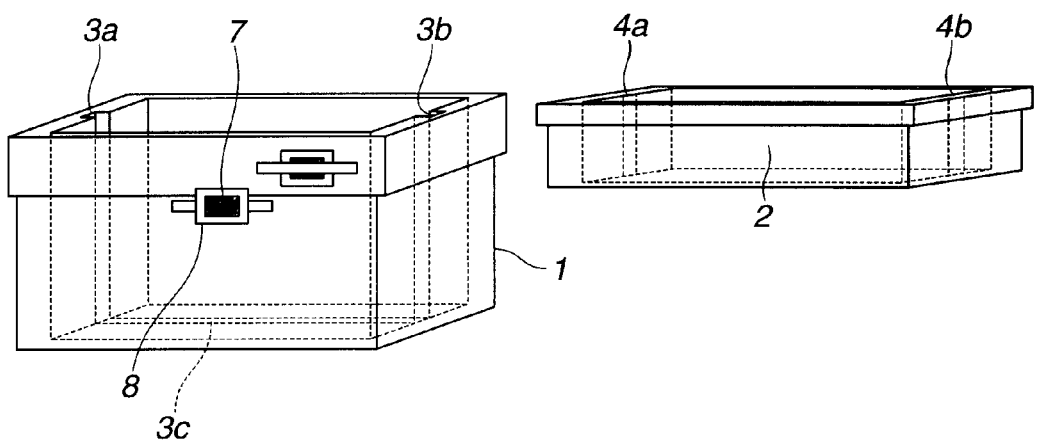
FIG. 3 is a schematic view of a container consisting of a housing and a lid and having one reservoir disposed on one inner wall in Example 2.
Figure 4:
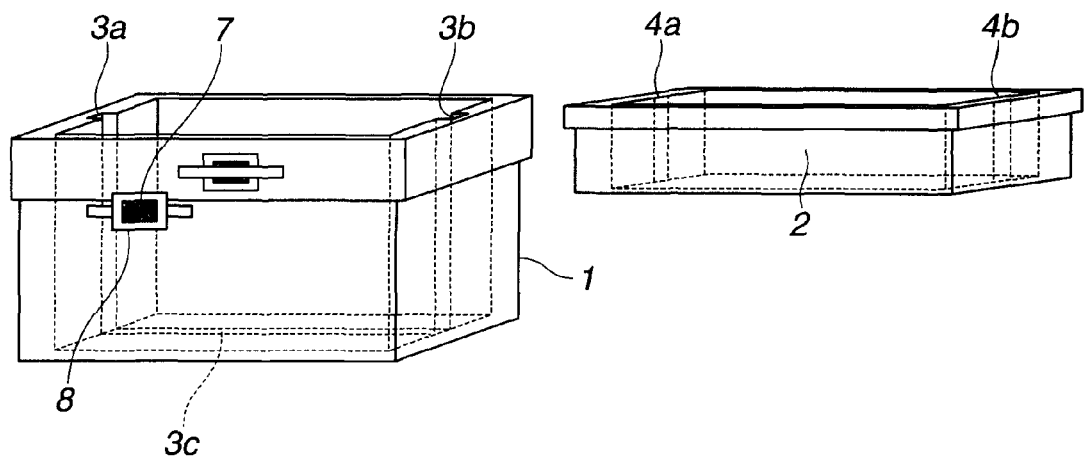
FIG. 4 is a schematic view of a container consisting of a housing and a lid and having one reservoir disposed on one inner wall in Example 3.

In one embodiment, reservoirs 8 of polyester nonwoven fabric each having received therein an absorber 7 are secured to the inner walls of housing 1 facing the front and back surfaces of the glass substrate using an adhesive 9. The number of reservoirs 8 is selected so as to give a ratio A/B within the range. In FIG. 1, two reservoirs are disposed on each of the opposed inner walls of the container (total four reservoirs). The number of reservoirs 8 is not limited thereto. For example, a single reservoir may be disposed on each of the opposed inner walls of the container (total two reservoirs) as shown in FIGS. 3 and 4, or a different number of reservoirs may be disposed on the opposed inner walls. In an alternative embodiment, one or more reservoirs are disposed only on one inner wall of the container facing the front surface of the glass substrate, and no reservoirs are disposed on the other inner wall of the container facing the back surface of the glass substrate.

Although the glass substrate is vertically held in the embodiment of FIG. 1, it may be horizontally held. In an embodiment, one pair of opposed inner walls of the housing are provided with supports of L-shaped cross-section. The glass substrate is supported along a pair of opposed side edges by the opposed supports. In the embodiment wherein the glass substrate is horizontally held in this way, the inner wall or walls of the container facing the front surface or the front and back surfaces of the glass substrate are the bottom of the housing and the ceiling of the lid, where the absorber reservoirs may be attached.

In the embodiment of FIG. 1, reservoirs 7 are disposed such that the longest straight distance (mm) between reservoir 7 and the surface of the glass substrate opposed thereto, depicted at L, is within 800 mm. More specifically, two reservoirs are disposed at two intersections which are defined by dividing the length (mm) of the short side and the length (mm) of the long side by 450 mm and integrally partitioning the short and long sides whereby partition lines cross at two intersections, while the longest straight distance L (mm) is within 800 mm.

In service, a synthetic quartz glass substrate is inserted into the storage container as constructed above, the lid is rested on the housing, and a sealing tape is wrapped along the mating line between the housing and the lid for achieving hermetic sealing of the container.

Suitable materials of which container housing 1, lid 2 and supports are made include resins such as, for example, polyethylene (PE), polybutylene terephthalate (PBT), polyethylene terephthalate (PET), polypropylene (PP), acrylonitrile-butadiene-styrene (ABS), polycarbonate (PC), polyacrylonitrile (PAN), polyoxymethylene (POM), polyoxyethylene (POE), polyvinyl chloride (PVC), polyvinylidene chloride (PVDC), polyvinylidene fluoride (PVDF), polether ether ketone (PEEK), polyurethane (PU), polyolefin (PO), polystyrene (PS), polymethyl methacrylate (PMMA), polytetrafluoroethylene (PTFE), polyisobutylene (PIB), polymethacrylonitrile (PMAN), polymethyl methacrylate (PMA), and polyethyl methacrylate (PEMA), and copolymers comprising at least one of the foregoing. In a preferred embodiment, the housing and lid are made of polycarbonate (PC) or polyacrylonitrile (PAN), and the supports are made of polycarbonate (PC) or polytetrafluoroethylene (PTFE).

The glass substrates to which the invention is applicable are not limited to the rectangular shape. Glass substrates of other shape such as circular shape may be contained in the container.

EXAMPLE

Examples of the invention are given below by way of illustration and not by way of limitation.

Example 1

Figure 2:
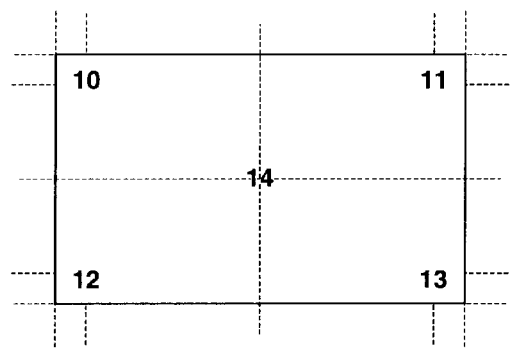
FIG. 2 schematically illustrates positions where water repellency is measured.

Four synthetic quartz glass substrates having rectangular surfaces of 800 mm short side and 920 mm long side and a thickness of 10 mm were furnished and cleaned. The front surface of the substrate was measured for water repellency using a contact angle meter. The measurement of contact angle was performed at five positions, that is, positions 10, 11, 12, 13 which are longitudinally and transversely spaced 10 mm from the four corners of the substrate front surface and a position 14 substantially corresponding to the center of the substrate front surface, as shown in FIG. 2. For all the four substrates, contact angle measurements at five positions showed no variations, with an average contact angle of 3.9°.

A storage container consisting of a rectangular box-shaped housing and a lid had a pair of rectangular inner walls of 800 mm short side and 920 mm long side facing a glass substrate as shown in FIG. 1, and two absorber reservoirs were disposed on each of the opposed inner walls. Each of the four glass substrates was contained in each of the four containers. The housing and lid of the container were made of polyacrylonitrile (PAN), and supports made of polytetrafluoroethylene (PTFE) were fitted in channels in the housing and lid inner walls.

The absorber reservoirs were disposed at positions which were determined by dividing the length (800 mm) of the short side and the length (920 mm) of the long side by 450 mm, and effecting integral partition, with the partition line partitioning the short side into ½ segments and the partition lines partitioning the long side into ⅓ segments crossing at two intersections. The spacing between the inner wall of the container and the front surface of the outermost glass substrate was 45 mm.

The reservoir was a bag of polyester nonwoven fabric containing fibrous activated carbon (commercially available as K Filter from Toyobo Co., Ltd., 7.5 g of activated carbon having a BET specific surface area of 1,500 m$^2$/g).

After the glass substrate was contained in the housing and the lid was rested on the housing, the container was sealed by wrapping a sealing tape at the mating line between the housing and the lid. The overall container was packed in a wrapping package and shelf stored for 36 days. The containment operation and storage were continued in a clean room which was cleaned through a ultra-low penetration air (ULPA) filter.

Thereafter, the container was opened in the clean room, and the front surface of the substrate was measured again for water repellency using a contact angle meter. Contact angle measurements at five positions showed little variations, with an average contact angle of 6.40. The distance between the four positions near the corners and the absorber reservoirs was 492 mm, and the distance between the center and the absorber reservoirs was 160 mm. All the four glass substrates had the same propensity, with little difference of contact angle. See Table 1.

Example 2

Four synthetic quartz glass substrates having rectangular surfaces of 800 mm short side and 920 mm long side and a thickness of 10 mm were measured for contact angle on the front surface as in Example 1. For all the four substrates, contact angle measurements at five positions showed no variations, with an average contact angle of 4.10.

Each of the four glass substrates was contained in each of the four storage containers each consisting of a rectangular box-shaped housing and a lid and having a pair of rectangular inner walls of 800 mm short side and 920 mm long side facing a glass substrate, with one absorber reservoir disposed on each inner wall as shown in FIG. 3. The materials of the container and reservoirs and the spacing between the housing inner wall and the substrate front surface were the same as in Example 1. The absorber reservoir was disposed at one position corresponding to the center (the intersection where the partition line partitioning the short side into ½ segments crossed the partition line partitioning the long side into ½ segments).

After storage for 36 days, the front surface of the substrate was measured again for water repellency using a contact angle meter. Of the contact angle measurements at five positions within the substrate, those at four near-corner positions remote from the absorber reservoir were relatively high (average of four 9.2°), and that at the center was as low as 6.3°. The distance between the four near-corner positions and the reservoir was 597 mm, and the distance between the center and the reservoir was 160 mm. All the four glass substrates had the same propensity with respect to the distribution of contact angle. See Table 1.

Example 3

Four synthetic quartz glass substrates having rectangular surfaces of 800 mm short side and 920 mm long side and a thickness of 10 mm were measured for contact angle on the front surface as in Example 1. For all the four substrates, contact angle measurements at five positions showed no variations, with an average contact angle of 3.9°.

Each of the four glass substrates was contained in each of the four storage containers each consisting of a rectangular box-shaped housing and a lid and having a pair of rectangular inner walls of 800 mm short side and 920 mm long side facing a glass substrate, with one absorber reservoir disposed on each inner wall as shown in FIG. 4. The materials of the container and reservoirs and the spacing between the housing inner wall and the substrate front surface were the same as in Example 1. The absorber reservoir was disposed at one position which was selected from the two intersections where the partition line partitioning the short side into ½ segments crossed the partition lines partitioning the long side into ⅓ segments.

After storage for 36 days, the front surface of the substrate was measured again for water repellency using a contact angle meter. Of the contact angle measurements at five positions within the substrate, those at two near-corner positions remote from the absorber reservoir were relatively high (average of two 11.6°), those at two near-corner positions close to the absorber reservoir and the center were as low as 5.9° on average. The distance between the two near-corner positions remote from the reservoir and the reservoir was 720 mm, the distance between the two near-corner positions close to the reservoir and the reservoir was 492 mm, and the distance between the center and the reservoir was 160 mm. All the four glass substrates had the same propensity with respect to the distribution of contact angle. See Table 1.

Example 4

Four synthetic quartz glass substrates having rectangular surfaces of 800 mm short side and 920 mm long side and a thickness of 10 mm were measured for contact angle on the front surface as in Example 1. For all the four substrates, contact angle measurements at five positions showed no variations, with an average contact angle of 3.8°.

Figure 5:
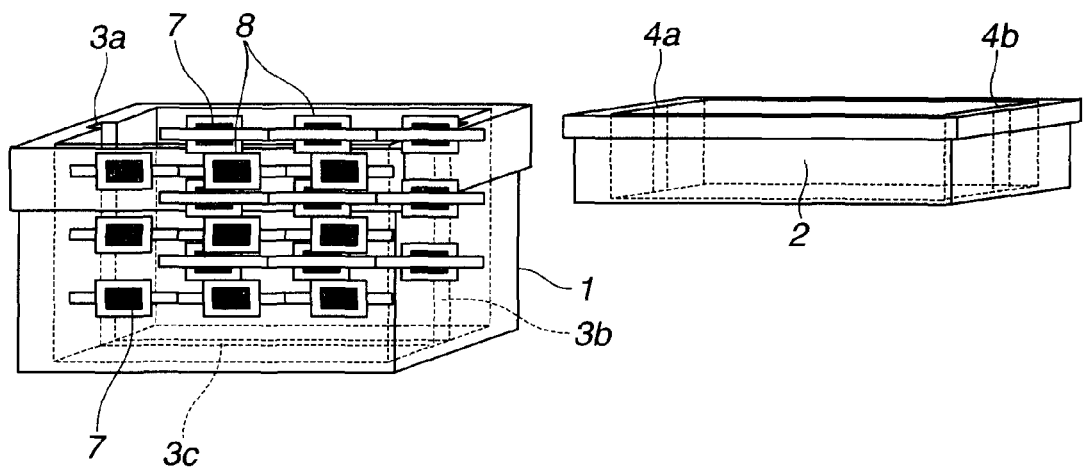
FIG. 5 is a schematic view of a container consisting of a housing and a lid and having nine reservoirs disposed on one inner wall in Example 4.

Each of the four glass substrates was contained in each of the four storage containers each consisting of a rectangular box-shaped housing and a lid and having a pair of rectangular inner walls of 800 mm short side and 920 mm long side facing a glass substrate, with nine absorber reservoirs disposed on each inner wall as shown in FIG. 5. The materials of the container and reservoirs and the spacing between the housing inner wall and the substrate front surface were the same as in Example 1. The absorber reservoirs were disposed at nine positions which were the intersections where the partition lines partitioning the short side into ¼ segments crossed the partition lines partitioning the long side into ¼ segments.

After storage for 36 days, the front surface of the substrate was measured again for water repellency using a contact angle meter. Contact angle measurements at five positions showed little variations, with an average contact angle of 5.1°. The distance between the four near-corner positions and the reservoir was 294 mm, and the distance between the center and the reservoir was 45 mm. All the four glass substrates had the same propensity, with little difference of contact angle. See Table 1.

Comparative Example 1

Four synthetic quartz glass substrates having rectangular surfaces of 800 mm short side and 920 mm long side and a thickness of 10 mm were measured for contact angle on the front surface as in Example 1. For all the four substrates, contact angle measurements at five positions showed no variations, with an average contact angle of 3.8°.

Each of the four glass substrates was contained in each of the four storage containers as in Example 1, except that no absorber reservoirs were disposed therein. After storage for 36 days, the front surface of the substrate was measured again for water repellency using a contact angle meter. Contact angle measurements at five positions had increased values, with an average contact angle of 16.7°. All the four glass substrates had the same propensity with respect to the distribution of contact angle. See Table 2.

It is believed that the front surface of glass substrates was contaminated with outgassing components and rendered water repellent by adsorption of some chemicals.

Comparative Example 2

Four synthetic quartz glass substrates having rectangular surfaces of 800 mm short side and 920 mm long side and a thickness of 10 mm were measured for contact angle on the front surface as in Example 1. For all the four substrates, contact angle measurements at five positions showed no variations, with an average contact angle of 3.5°.

Each of the four glass substrates was contained in a storage container as in Example 1, except that the reservoir received 1.0 g of activated carbon having a BET specific surface area of 1,500 m$^2$/g. After storage for 36 days, the front surface of the substrate was measured again for water repellency using a contact angle meter. Contact angle measurements at five positions showed some variations, with an average contact angle of 10.8°. All the four glass substrates had the same propensity with respect to the distribution of contact angle. See Table 2.

TABLE 1

| | | Example 1 | | | Example 2 | | | Example 3 | | | Example 4 | | |
|---|---|---|---|---|---|---|---|---|---|---|---|---|---|
| | | Number of activated carbon bags per wall | | | | | | | | | | | |
| | | 2 | | | 1 | | | 1 | | | 9 | | |
| | | A/B | | | | | | | | | | | |
| | | 3.1 m²/cm² | | | 1.5 m²/cm² | | | 1.5 m²/cm² | | | 13.8 m²/cm² | | |
| Substrate | Positions | Distance from reservoir (mm) | Initial contact angle (°) | Contact angle after 36-day storage (°) | Distance from reservoir (mm) | Initial contact angle (°) | Contact angle after 36-day storage (°) | Distance from reservoir (mm) | Initial contact angle (°) | Contact angle after 36-day storage (°) | Distance from reservoir (mm) | Initial contact angle (°) | Contact angle after 36-day storage (°) |
| No. 1 | 10 | 492 | 3.8 | 3.7 | 597 | 4.1 | 10.4 | 492 | 2.8 | 4.8 | 294 | 3.9 | 5.1 |
| | 11 | 492 | 4.0 | 7.3 | 597 | 4.2 | 9.5 | 720 | 3.4 | 11.2 | 294 | 4.3 | 6.2 |
| | 12 | 492 | 4.1 | 7.6 | 597 | 3.7 | 9.1 | 492 | 3.6 | 5.8 | 294 | 4.7 | 4.2 |
| | 13 | 492 | 3.9 | 4.6 | 597 | 4.8 | 12.1 | 720 | 3.7 | 13.0 | 294 | 3.3 | 5.1 |
| | 14 | 160 | 5.0 | 4.8 | 45 | 3.2 | 5.4 | 160 | 2.9 | 7.1 | 160 | 3.2 | 7.0 |
| No. 2 | 10 | 492 | 4.5 | 5.8 | 597 | 3.4 | 9.1 | 492 | 4.0 | 6.7 | 294 | 2.8 | 4.8 |
| | 11 | 492 | 4.2 | 8.5 | 597 | 3.7 | 7.2 | 720 | 4.1 | 10.1 | 294 | 4.0 | 4.7 |
| | 12 | 492 | 3.4 | 7.3 | 597 | 3.7 | 11.0 | 492 | 4.8 | 7.4 | 294 | 4.2 | 6.1 |
| | 13 | 492 | 2.9 | 7.5 | 597 | 4.1 | 10.2 | 720 | 3.7 | 10.9 | 294 | 3.6 | 4.7 |
| | 14 | 160 | 4.1 | 7.6 | 45 | 4.0 | 7.5 | 160 | 3.4 | 4.7 | 160 | 3.6 | 4.5 |
| No. 3 | 10 | 492 | 4.1 | 7.1 | 597 | 4.7 | 7.8 | 492 | 4.5 | 4.1 | 294 | 4.4 | 6.0 |
| | 11 | 492 | 4.0 | 7.1 | 597 | 4.7 | 8.4 | 720 | 4.8 | 14.1 | 294 | 4.8 | 4.7 |
| | 12 | 492 | 3.4 | 8.6 | 597 | 3.7 | 9.2 | 492 | 3.7 | 6.2 | 294 | 3.8 | 5.1 |
| | 13 | 492 | 4.6 | 4.7 | 597 | 4.3 | 10.4 | 720 | 3.1 | 11.1 | 294 | 3.4 | 5.4 |
| | 14 | 160 | 3.4 | 6.4 | 45 | 3.8 | 5.9 | 160 | 3.8 | 6.8 | 160 | 2.8 | 4.8 |
| No. 4 | 10 | 492 | 3.2 | 6.8 | 597 | 3.9 | 8.1 | 492 | 3.5 | 5.5 | 294 | 4.8 | 7.2 |
| | 11 | 492 | 3.7 | 4.5 | 597 | 4.5 | 8.4 | 720 | 3.9 | 9.9 | 294 | 4.2 | 3.7 |
| | 12 | 492 | 3.8 | 4.8 | 597 | 4.6 | 8.9 | 492 | 4.5 | 4.2 | 294 | 4.3 | 4.2 |
| | 13 | 492 | 4.0 | 6.2 | 597 | 4.6 | 7.2 | 720 | 4.4 | 12.2 | 294 | 3.2 | 4.1 |
| | 14 | 160 | 4.2 | 6.7 | 45 | 3.9 | 6.2 | 160 | 4.8 | 7.2 | 160 | 3.4 | 5.0 |
| Average | 10 | 492 | 3.9 | 5.9 | 597 | 4.0 | 8.9 | 492 | 3.7 | 5.3 | 294 | 4.0 | 5.8 |
| | 11 | 492 | 4.0 | 6.9 | 597 | 4.3 | 8.4 | 720 | 4.1 | 11.3 | 294 | 4.3 | 4.8 |
| | 12 | 492 | 3.7 | 7.1 | 597 | 3.9 | 9.6 | 492 | 4.2 | 5.9 | 294 | 4.3 | 4.9 |
| | 13 | 492 | 3.9 | 5.8 | 597 | 4.5 | 10.0 | 720 | 3.7 | 11.8 | 294 | 3.4 | 4.8 |
| | 14 | 160 | 4.2 | 6.4 | 45 | 3.7 | 6.3 | 160 | 3.7 | 6.5 | 160 | 3.3 | 5.3 |
| | All positions | | 3.9 | 6.4 | | 4.1 | 8.6 | | 3.9 | 8.2 | | 3.8 | 5.1 |

TABLE 2

| | | Comparative Example 1 | | | Comparative Example 2 | | |
|---|---|---|---|---|---|---|---|
| | | Number of activated carbon bags per wall | | | | | |
| | | 0 | | | 2 | | |
| | | A/B | | | | | |
| | | 0 m²/cm² | | | 0.4 m²/cm² | | |
| Substrate | Positions | Distance from reservoir (mm) | Initial contact angle (°) | Contact angle after 36-day storage (°) | Distance from reservoir (mm) | Initial contact angle (°) | Contact angle after 36-day storage (°) |
| No. 1 | 10 | — | 3.9 | 18.8 | 492 | 4.0 | 14.0 |
| | 11 | — | 4.3 | 14.8 | 492 | 2.9 | 10.4 |
| | 12 | — | 4.7 | 11.8 | 492 | 2.8 | 11.3 |
| | 13 | — | 3.3 | 19.7 | 492 | 3.1 | 9.2 |
| | 14 | — | 3.2 | 17.8 | 160 | 3.5 | 6.8 |
| No. 2 | 10 | — | 2.8 | 16.0 | 492 | 4.1 | 15.3 |
| | 11 | — | 4.0 | 15.3 | 492 | 4.2 | 7.9 |
| | 12 | — | 4.2 | 13.9 | 492 | 4.6 | 12.2 |
| | 13 | — | 3.6 | 18.5 | 492 | 4.2 | 11.0 |
| | 14 | — | 3.6 | 19.4 | 160 | 3.9 | 8.0 |
| No. 3 | 10 | — | 4.4 | 14.5 | 492 | 3.4 | 15.4 |
| | 11 | — | 4.8 | 20.0 | 492 | 3.5 | 17.7 |
| | 12 | — | 3.8 | 15.6 | 492 | 3.0 | 13.9 |
| | 13 | — | 3.4 | 19.4 | 492 | 3.9 | 9.2 |
| | 14 | — | 2.8 | 20.1 | 160 | 3.1 | 4.8 |
| No. 4 | 10 | — | 4.8 | 14.2 | 492 | 3.8 | 16.1 |
| | 11 | — | 4.2 | 14.5 | 492 | 2.8 | 11.8 |
| | 12 | — | 4.3 | 17.7 | 492 | 3.4 | 7.8 |

TABLE 2-continued

| | | Comparative Example 1 | | | Comparative Example 2 | | |
|---|---|---|---|---|---|---|---|
| | | Number of activated carbon bags per wall | | | | | |
| | | 0 | | | 2 | | |
| | | A/B | | | | | |
| | | 0 m²/cm² | | | 0.4 m²/cm² | | |
| Substrate | Positions | Distance from reservoir (mm) | Initial contact angle (°) | Contact angle after 36-day storage (°) | Distance from reservoir (mm) | Initial contact angle (°) | Contact angle after 36-day storage (°) |
| | 13 | — | 3.2 | 18.8 | 492 | 3.2 | 6.9 |
| | 14 | — | 3.4 | 12.4 | 160 | 3.2 | 6.7 |
| Average | 10 | — | 4.0 | 15.9 | 492 | 3.8 | 15.2 |
| | 11 | — | 4.3 | 16.2 | 492 | 3.4 | 12.0 |
| | 12 | — | 4.3 | 14.8 | 492 | 3.5 | 11.3 |
| | 13 | — | 3.4 | 19.1 | 492 | 3.6 | 9.1 |
| | 14 | — | 3.3 | 17.4 | 160 | 3.4 | 6.6 |
| | All positions | | 3.8 | 16.7 | | 3.5 | 10.8 |

Japanese Patent Application No. 2007-199626 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A storage container for containing a synthetic quartz glass substrate for use as photomask, the glass substrate having front and back surfaces, said storage container comprising:
   a first inner wall;
   a second inner wall opposite to the first inner wall;
   a third inner wall;
   a fourth inner wall opposite to the third inner wall;
   a single pair of a first channel on the third inner wall and a second channel on the fourth inner wall, the first channel being facing the second channel each other, an area being formed between the first channel and the second channel, the area facing the first inner wall and the second inner wall, the area being to house the glass substrate;
   a first reservoir for an absorber on the first inner wall;
   a second reservoir for the absorber on the second inner wall, the absorber absorbing components outgassing from the container;
   a lid having a mating line, wherein the mating line achieves hermetic sealing of the container,
   wherein
   a ratio A/B is in the range of 1.0 to 120 m²/cm² provided that A is a product (m²) of the total weight (g) of the absorber multiplied by the BET specific surface area (m²/g) of the absorber and B is the total area (cm²) of the front surface or the front and back surfaces of the glass substrate facing the first and second inner walls provided with the first and second reservoirs,
   wherein at least one of the first and the second reservoirs is disposed at a position that the longest straight distance L (mm) between said at least one of the first and the second reservoirs, and the glass substrate opposed thereto is within 800 mm.

2. The storage container of claim 1 wherein the container is rectangular parallelepiped,
   wherein said position is at least one position selected from intersections and the center of the inner walls, said intersections being defined by dividing the length (mm) of the short side and the length (mm) of the long side by 450 mm, omitting decimal parts from the divided values, thus obtaining integral values, and equidistantly partitioning the short and long sides of the inner walls at partition lines corresponding to the integral values, with the partition lines crossing to define intersections.

3. The storage container of claim 1 wherein the glass substrate is held within the area.

4. The storage container of claim 3 wherein when the glass substrate is vertically or horizontally held in the container, the space inside the container is divided into compartments by the glass substrate.

5. The storage container of claim 1 wherein the synthetic quartz glass substrate is a rectangular substrate having a short side of at least 300 mm and a long side of at least 400 mm.

6. The storage container of claim 1 wherein said absorber comprises activated carbon.

7. The storage container of claim 1 wherein said reservoir is a flat bag made of gas permeable nonwoven fabric of synthetic resin.

8. The storage container of claim 1, wherein the glass substrate is housed within the area, wherein the first reservoir houses the absorber, and wherein the second reservoir houses the absorber.

9. A storage container having at least one synthetic quartz glass for use as photomask contained therein with at least one absorber, the glass substrate having front and back surfaces, said storage container comprising:
   a first inner wall:
   a second inner wall opposite to the first inner wall;
   a third inner wall;
   a fourth inner wall opposite to the third inner wall;
   an area being formed between the third inner wall and the fourth inner wall, the area facing the first inner wall and the second inner wall, the area being to house the glass substrate;
   a first reservoir for the absorber on the first inner wall;
   a second reservoir for the absorber on the second inner wall, the absorber absorbing components outgassing from the container;

a lid capable of achieving hermetic sealing of the container, a ratio A/B is in the range of 1.0 to 120 m$^2$/cm$^2$ provided that A is a product (m$^2$) of the total weight (g) of the absorber multiplied by the BET specific surface area (m$^2$/g) of the absorber and B is the total area (cm$^2$) of the front surface or the front and back surfaces of the glass substrate facing the first and second inner walls provided with the first and second reservoirs, wherein at least one of the first and the second reservoirs is disposed at a position that the longest straight distance L (mm) between said at least one of the first and the second reservoirs, and the glass substrate opposed thereto is within 800 mm.

10. The storage container of claim 9 wherein a single pair of a first channel on the third inner wall and a second channel on the fourth inner wall are formed, and the first channel is facing the second channel each other.

11. The storage container of claim 9, wherein the glass substrate is housed within the area, wherein the first reservoir houses the absorber, and wherein the second reservoir houses the absorber.

* * * * *